(12) United States Patent
Park et al.

(10) Patent No.: US 8,222,534 B2
(45) Date of Patent: Jul. 17, 2012

(54) PRINTED CIRCUIT BOARD AND MANUFACTURING METHOD THEREOF

(75) Inventors: Jun-Heyoung Park, Suwon-si (KR); Jee-Soo Mok, Yongin-si (KR); Ki-Hwan Kim, Suwon-si (KR); Sung-Yong Kim, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 92 days.

(21) Appl. No.: 12/076,118

(22) Filed: Mar. 13, 2008

(65) Prior Publication Data

US 2008/0310132 A1 Dec. 18, 2008

(30) Foreign Application Priority Data

Jun. 18, 2007 (KR) .................. 10-2007-0059323

(51) Int. Cl.
*H05K 1/11* (2006.01)
*H05K 3/02* (2006.01)
(52) U.S. Cl. .......................................... 174/261; 29/847
(58) Field of Classification Search ............ 174/261–266; 29/830, 847
See application file for complete search history.

(56) References Cited

U.S. PATENT DOCUMENTS

| 5,976,699 | A * | 11/1999 | Hosomi et al. ............... 428/418 |
| 6,191,489 | B1 * | 2/2001 | Igel et al. ..................... 257/778 |
| 6,921,715 | B2 * | 7/2005 | Shen ............................. 438/612 |
| 7,230,339 | B2 * | 6/2007 | Key et al. ..................... 257/773 |
| 2002/0145178 | A1 * | 10/2002 | Tsao et al. ..................... 257/620 |
| 2004/0233035 | A1 * | 11/2004 | Fjelstad ........................ 338/260 |

FOREIGN PATENT DOCUMENTS

| JP | 8-293661 | 11/1996 |
| JP | 2002-290048 | 10/2002 |
| KR | 10-2007-0025496 | 3/2007 |

OTHER PUBLICATIONS

Office Action mailed on Mar. 26, 2008 and issued in corresponding Korean Patent Application No. 10-2007-0059323.
Japanese Office Action issued Mar. 16, 2010 in corresponding Japanese Patent Application 2008-095405.

* cited by examiner

*Primary Examiner* — Jeremy Norris

(57) ABSTRACT

A printed circuit board and a method of manufacturing the printed circuit board are disclosed. The method of manufacturing a printed circuit board, by forming at least one bump for interlayer conduction on a surface of a board and stacking an insulation layer on the surface of the board, can include the operations of forming at least one dam on the surface of the board that surrounds a region corresponding to the bump, forming the bump by printing conductive paste onto the region corresponding to the bump, and stacking the insulation layer onto the surface of the board. This method can be utilized to improve productivity and resolve the problem of spreading.

3 Claims, 23 Drawing Sheets

PRINTED CIRCUIT BOARD AND MANUFACTURING METHOD THEREOF

CROSS-REFERENCE TO RELATED APPLICATIONS

This application claims the benefit of Korean Patent Application No. 10-2007-0059323 filed with the Korean Intellectual Property Office on Jun. 18, 2007, the disclosure of which is incorporated herein by reference in its entirety.

BACKGROUND

1. Technical Field

The present invention relates to a printed circuit board and to a method of manufacturing the printed circuit board.

2. Description of the Related Art

Among the various methods for manufacturing a printed circuit board, one method currently being used to manufacture a high-density printed circuit board is illustrated in FIGS. 1A to 1H, which includes forming bumps 3 on a board 2, stacking on an insulation layer 4, and stacking this in turn onto a multi-layer board 1, etc., while applying heat and pressure. This is referred to as a B2it method. With the B2it method, vias for interlayer conduction can be formed in a simple manner, whereby manufacturing efficiency can be increased.

The B2it method includes forming paste bumps, using copper (Cu), silver (Ag), etc., on a copper foil, piling an insulation layer with the copper foil, and then applying heat and pressure for stacking. In the B2it method, the process of printing the paste has to be performed such that the bumps have a height sufficient to penetrate the insulation layer. Thus, as illustrated in FIGS. 2A and 2B, the conductive paste 3a, 3b may be printed on the lands 9 formed on an insulation layer 4' over a series of four or five repetitions. As such, the repeated printing intended for forming the bumps to a particular height can lower productivity, and can cause spreading at the lower ends of the bumps.

SUMMARY

An aspect of the invention is to provide a printed circuit board and a method of manufacturing the printed circuit board, which improve productivity and resolve the problem of spreading.

One aspect of the invention provides a method of manufacturing a printed circuit board by forming at least one bump for interlayer conduction on a surface of a board and stacking an insulation layer on the surface of the board. The method includes forming at least one dam on the surface of the board that surrounds a region corresponding to the bump, forming the bump by printing conductive paste onto the region corresponding to the bump, and stacking the insulation layer onto the surface of the board.

Forming the dam can be performed by selectively etching a metal layer stacked on the surface of the board, and the dam can be made of a material including copper.

Another aspect of the invention provides a printed circuit board that includes a board, a bump formed on a surface of the board, a dam formed on the surface of the board that surrounds an edge of the bump, and a first insulation layer stacked on the surface of the board.

The board can be a copper clad laminate (CCL), which has a copper foil stacked on a second insulation layer, in which case the dam may be shaped by selectively removing the copper foil.

Additional aspects and advantages of the present invention will be set forth in part in the description which follows, and in part will be obvious from the description, or may be learned by practice of the invention.

DETAILED DESCRIPTION

Figure 1A:
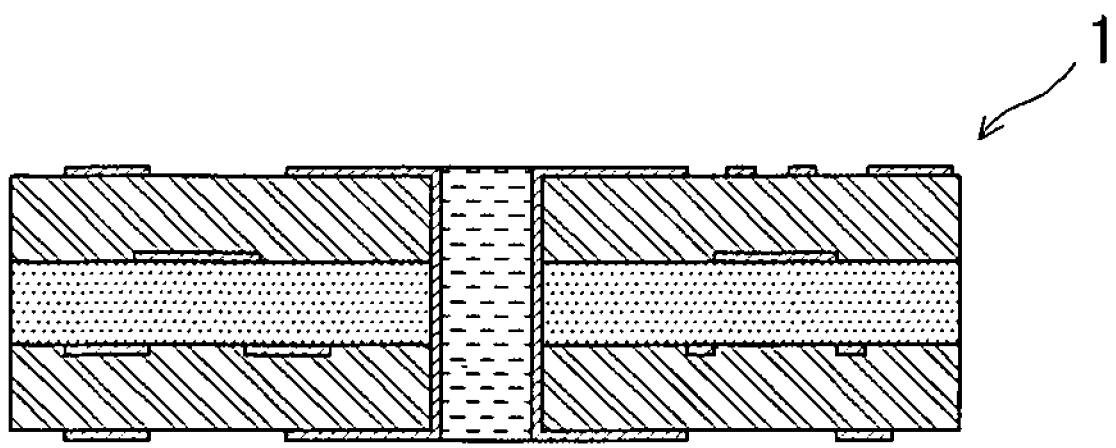
FIG. 1A, FIG. 1B, FIG. 1C, FIG. 1D, FIG. 1E, FIG. 1F, FIG. 1G, and FIG. 1H are cross-sectional views representing a flow diagram for a method of manufacturing a printed circuit board according to the related art.
Figure 1B:
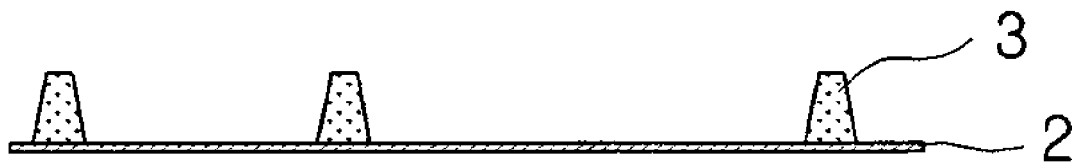
Figure 1C:
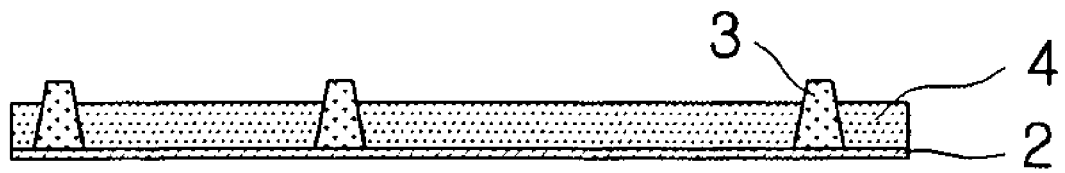
Figure 1D:
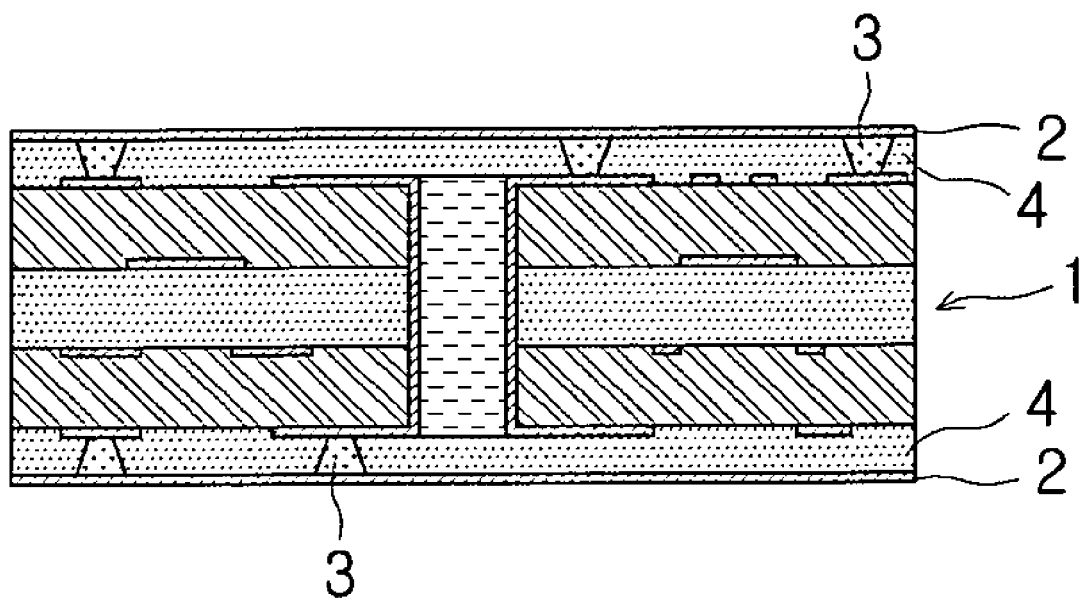
Figure 1E:
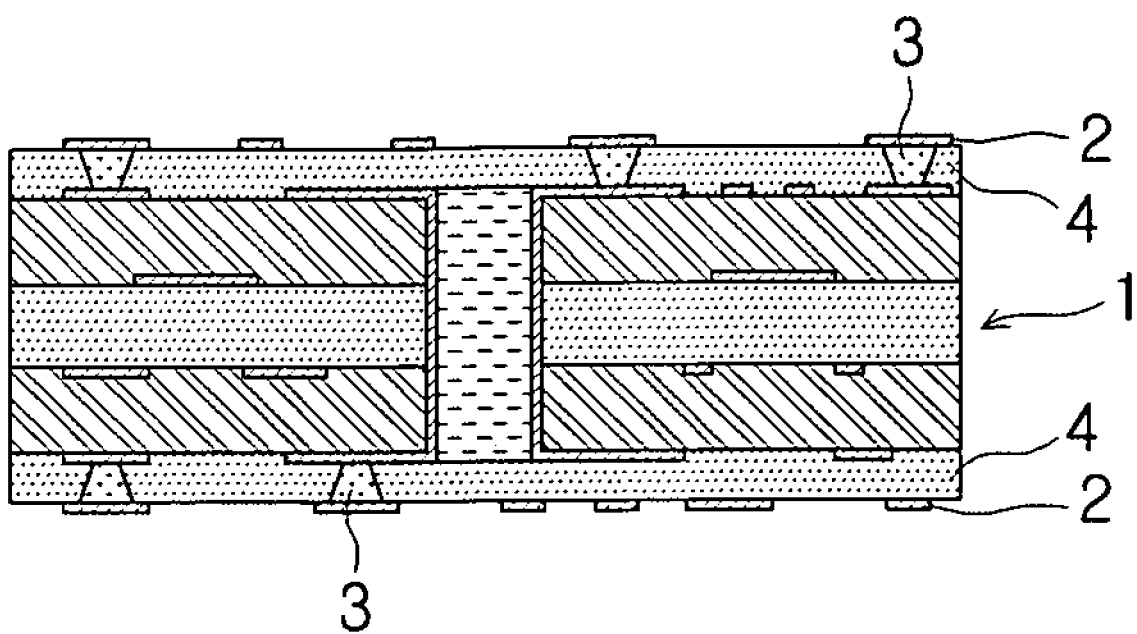
Figure 1F:
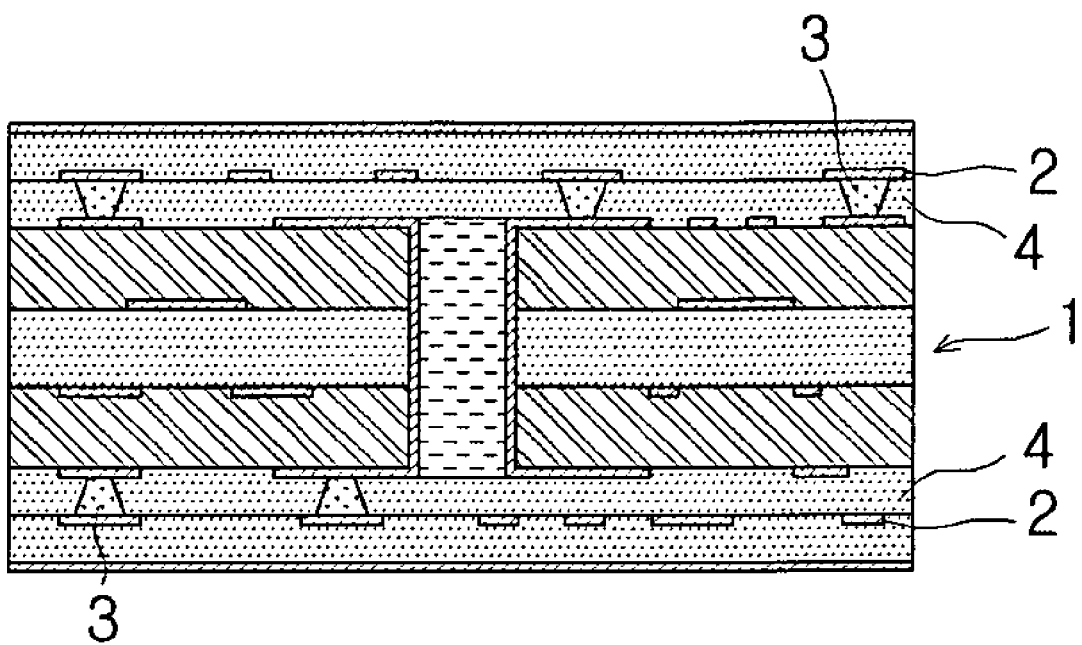
Figure 1G:
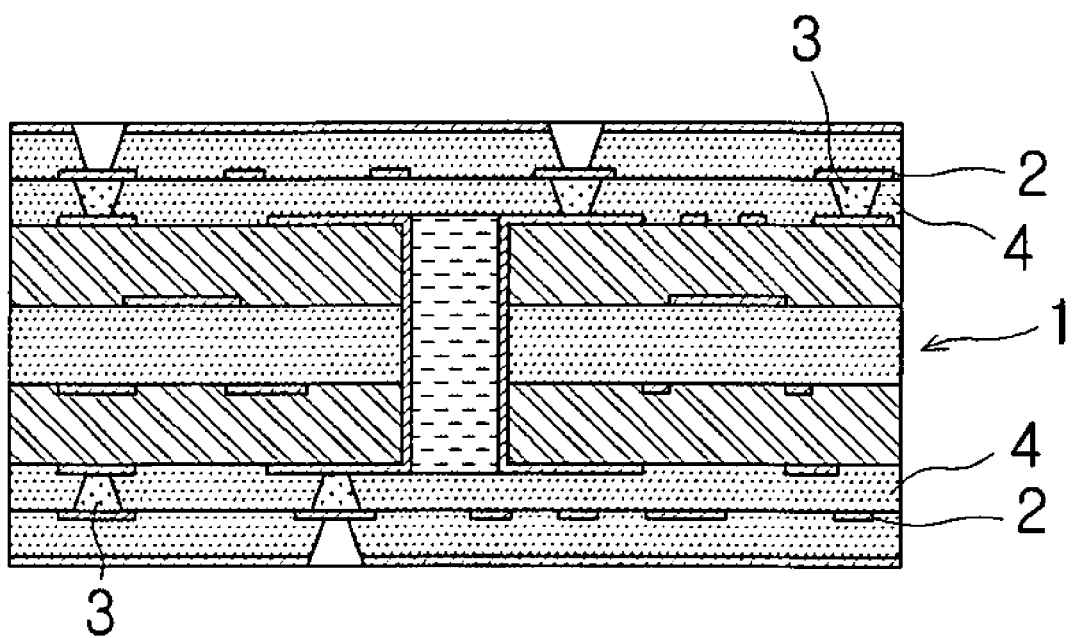
Figure 1H:
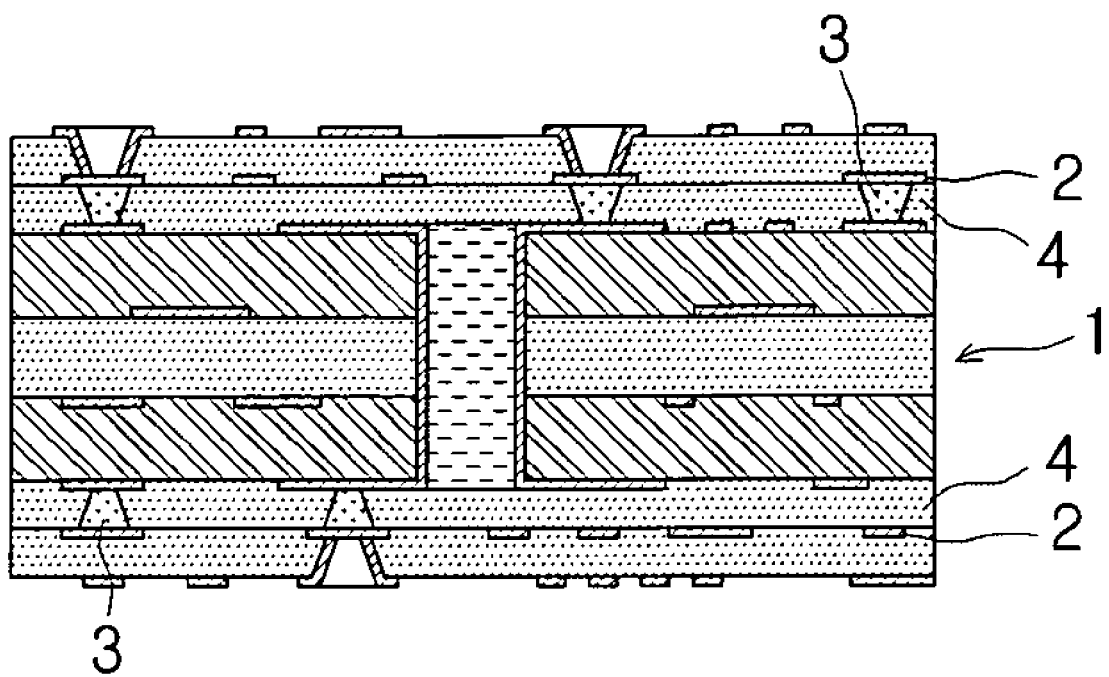
Figure 2A:
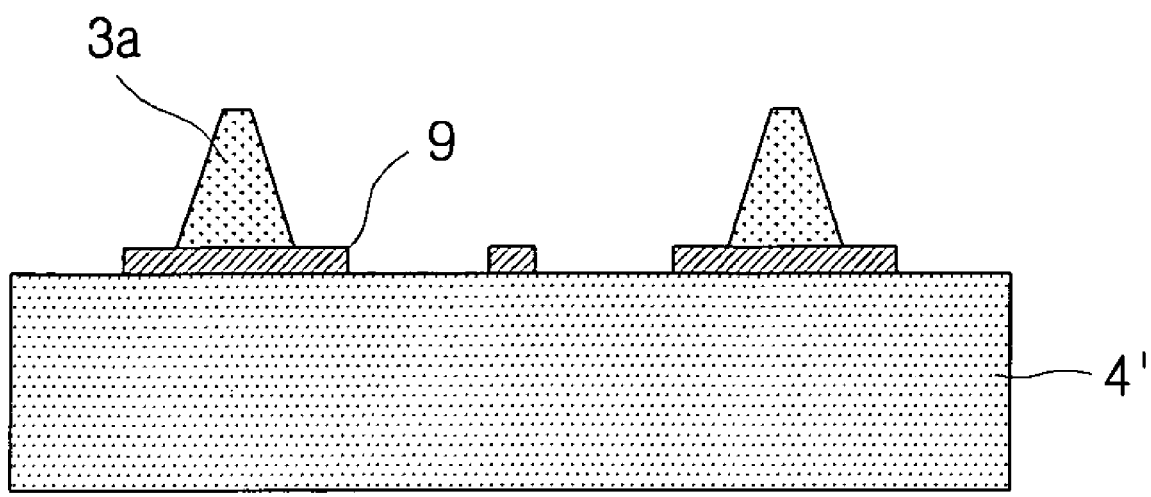
FIG. 2A and FIG. 2B are cross-sectional views representing a flow diagram for a method of forming bumps according to the related art.
Figure 2B:
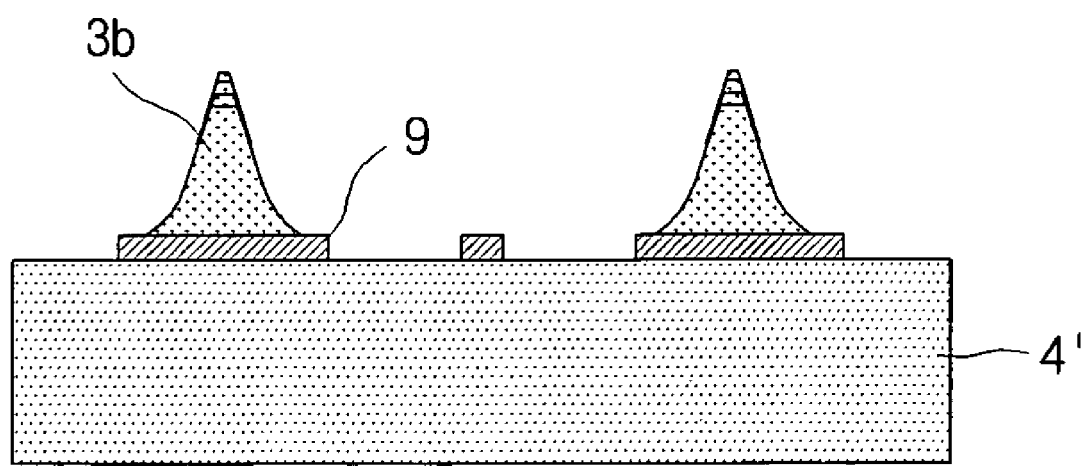

The printed circuit board and method of manufacturing the printed circuit board according to certain embodiments of the invention will be described below in more detail with reference to the accompanying drawings. Those components that are the same or are in correspondence are rendered the same reference numeral regardless of the figure number, and redundant explanations are omitted.

First, the method of manufacturing a printed circuit board according to one aspect of the invention will be described as follows.

Figure 3:
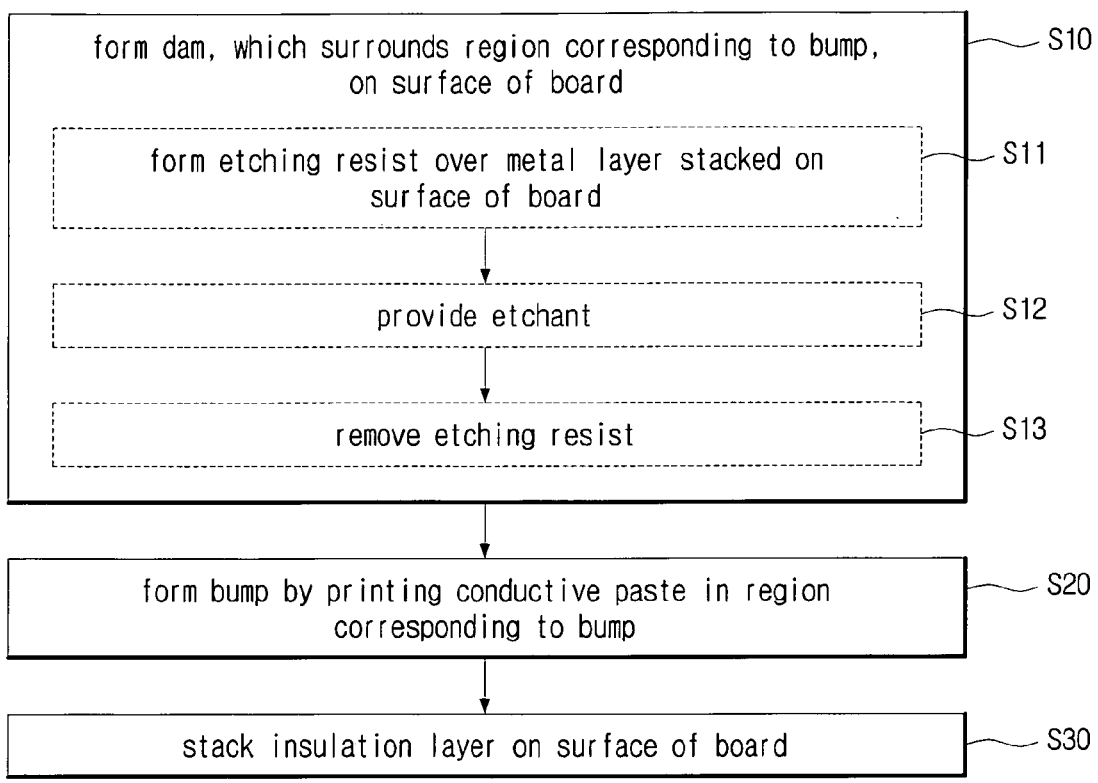
FIG. 3 is a flowchart illustrating a method of manufacturing a printed circuit board according to an aspect of the invention.

FIG. 3 is a flowchart illustrating a method of manufacturing a printed circuit board according to an aspect of the invention, and FIG. 4A through FIG. 4H are cross-sectional views representing a flow diagram for the method illustrated in FIG. 3. In FIGS. 4A to 4H are illustrated a four-layer board 10, insulation layers 20a, 20b, patterns 22a, 22b, dams 24, bumps 30, and bump boards 40.

First, dams 24 may be formed, which surround regions corresponding to bumps 30, on a surface of a board (S10). The board may provide the position where the bumps 30 are to be formed, and in this particular embodiment, an insulation layer 20a can be used for the board. Of course, the board can take a form other than an insulation layer 20a. For example, a double-sided printed circuit board can be used that already has particular patterns formed on either side.

The insulation layer 20a may serve to electrically insulate the upper and lower layers of the printed circuit board. A particular pattern may be formed on the lower surface of the insulation layer 20a, and may even have several layers of boards stacked thereon.

A dam 24 can serve to confine the region of a bump that interconnects layers, as well as to provide support for the bump 30. A method of forming the dams 24 will be described in more detail as follows.

First, an etching resist (not shown) may be formed on a metal layer (not shown) stacked on a surface of the insulation layer 20a (S11). The etching resist (not shown) can be formed to cover the metal layer (not shown) in positions where the dams 24 are to be formed. This etching resist (not shown) can be formed using a mask, by a method of exposure and development, etc. A copper clad laminate (CCL), which has a copper foil stacked on either side of an insulating layer, can be used for the insulation layer 20a and the metal layer (not shown) stacked on the insulation layers 20a.

Next, an etchant may be provided (S12). Using an etchant, the portions other than those portions covered by the etching resist (not shown) can be removed. Afterwards, the etching resist (not shown) may be removed (S13).

Figure 4A:
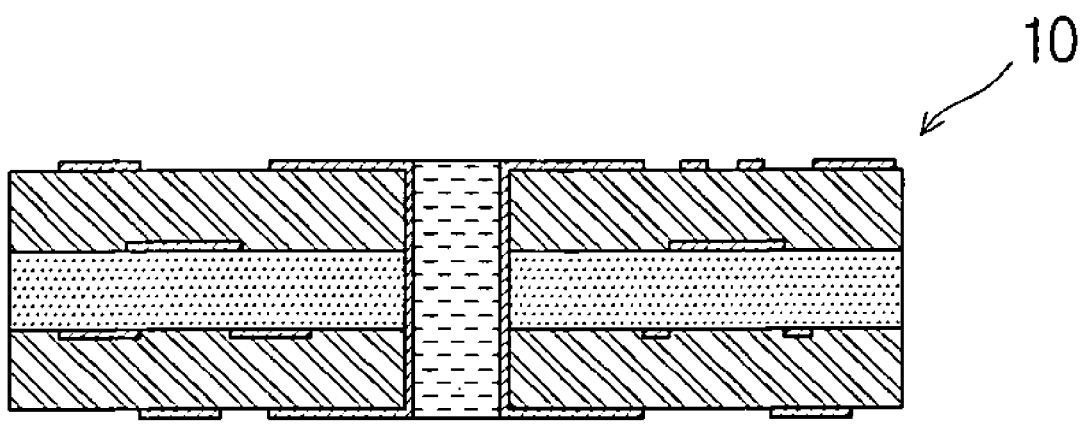
FIG. 4A, FIG. 4B, FIG. 4C, FIG. 4D, FIG. 4E, FIG. 4F, FIG. 4G, and FIG. 4H are cross-sectional views representing a flow diagram for the method illustrated in FIG. 3.
Figure 4B:
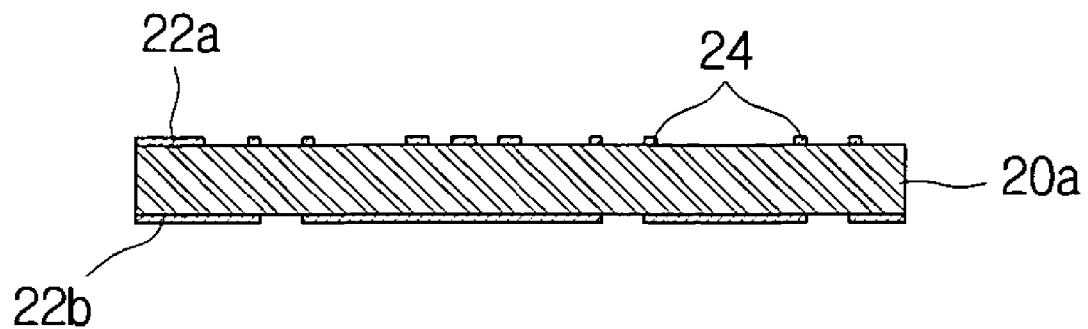
Figure 4C:
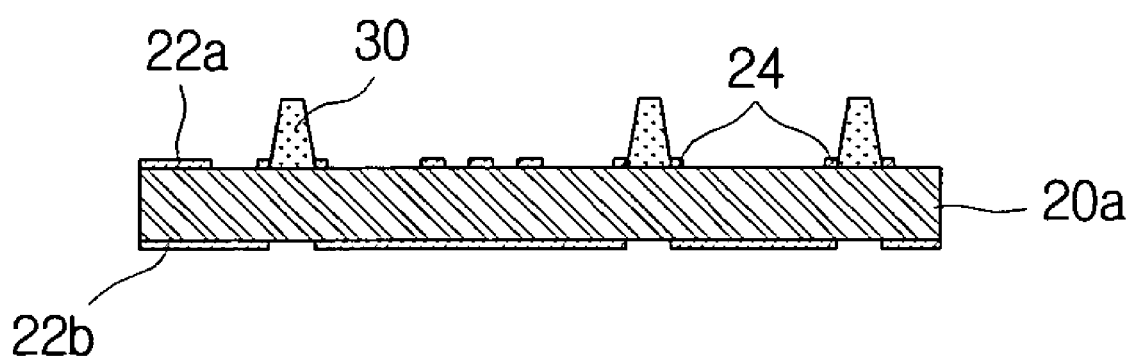
Figure 4D:
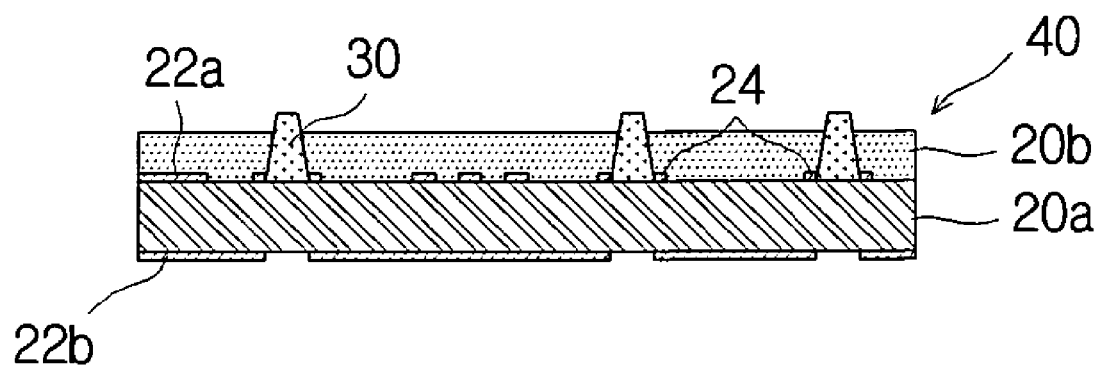
Figure 5:
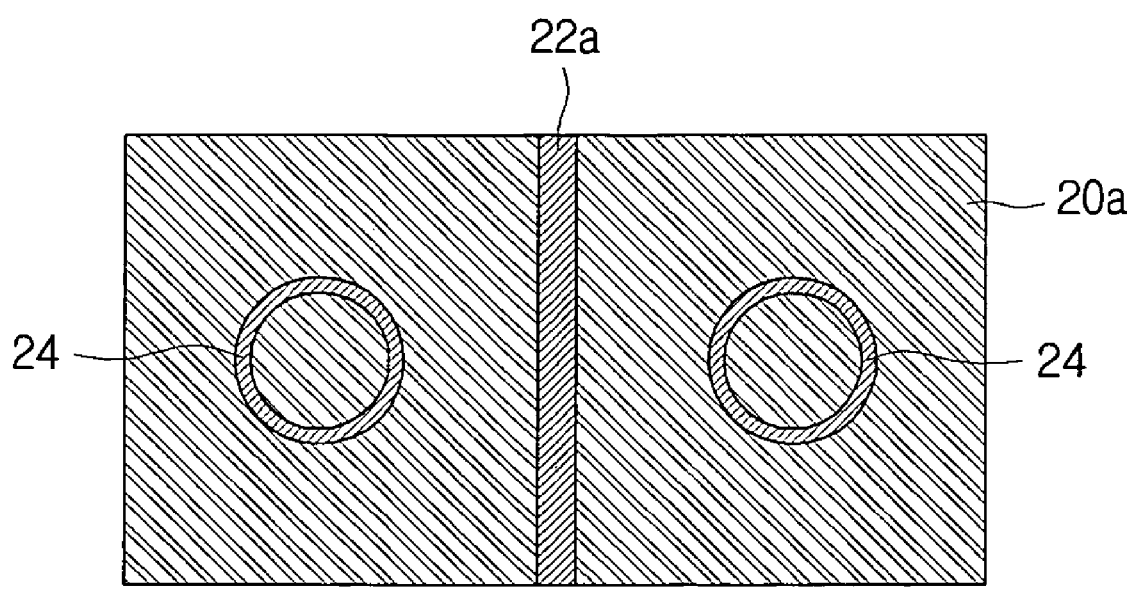
FIG. 5 is a plan view illustrating a board on which dams have been formed.

In cases where the dams 24 are formed by the method described above, the dams 24 can be formed simultaneously during the process for forming the patterns 22a, etc., on the insulation layer 20a. As such, since there is no need for a separate process in forming the dams 24, the manufacturing process can be simplified. An example of the patterns 22a and dams 24 formed on the insulation layer 20a is illustrated in FIG. 4B and FIG. 5.

Figure 6A:
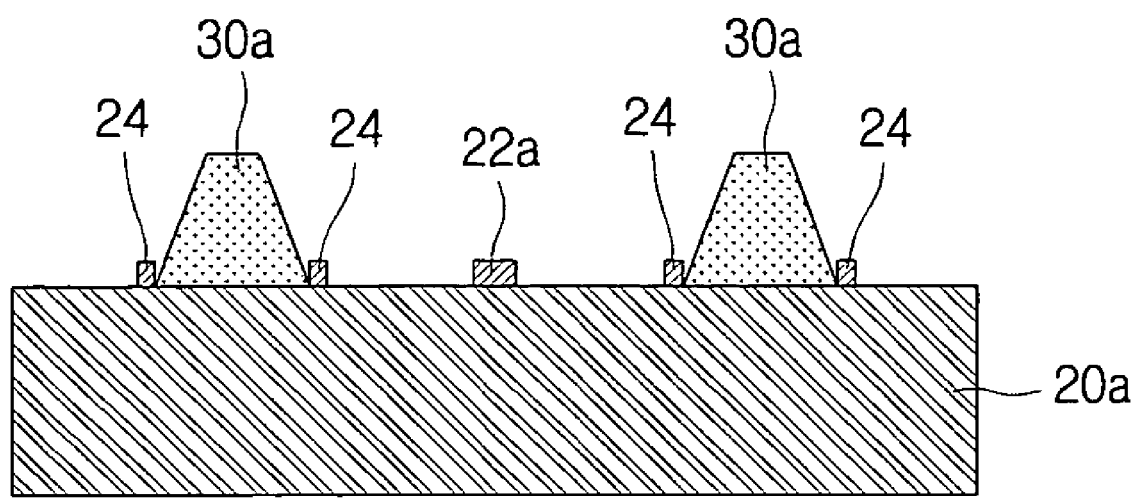
FIG. 6A and FIG. 6B are cross-sectional views representing a flow diagram for a method of forming bumps.
Figure 6B:
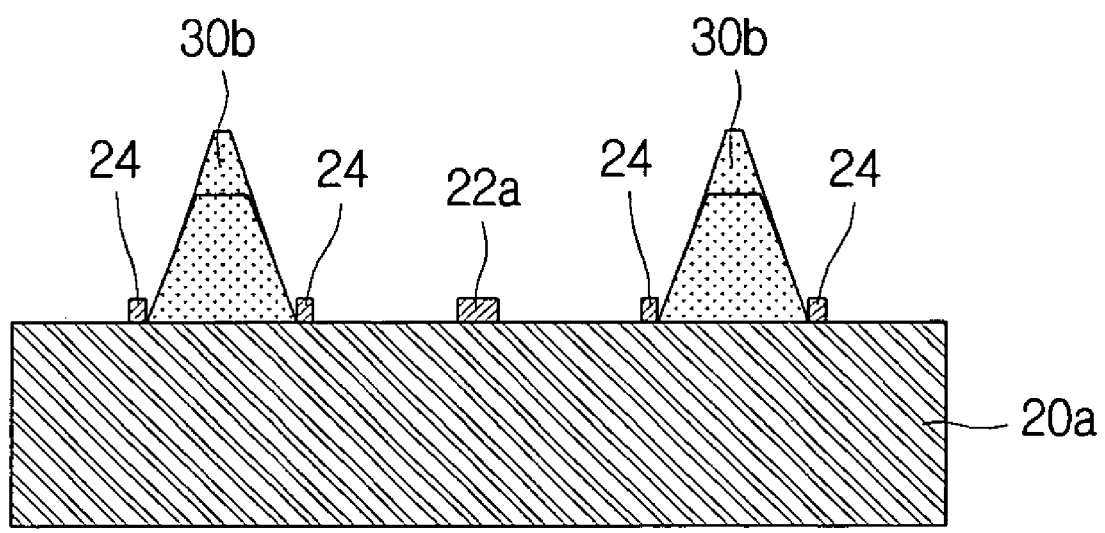

After thus forming the dams 24, conductive paste may be printed to form the bumps 30 (S20). As illustrated in FIGS. 6A and 6B, the regions where the conductive paste 30a, 30b are printed may be surrounded by the dams 24. Therefore, during the procedure for forming the bumps 30 by printing the conductive paste 30a, 30b, the lower ends of the bumps 30 may be supported by the dams 24, and the areas of the board occupied by the bumps 30 can be limited by the dams 24.

In this way, the lower ends of the bumps 30 can be prevented from spreading to a wider area than that intended. Also, compared to those cases in which dams 24 are not formed, relatively larger amounts of conductive paste 30a, 30b can be printed in one round.

Therefore, the number of repetitions of printing for forming the bumps 30 to a particular height can be reduced, to confer an aspect of increased productivity. The results of repeatedly printing the conductive paste 30a, 30b are illustrated in FIGS. 6A and 6B, and the bumps 30 thus formed can be seen also in FIG. 4C.

Next, an insulation layer may be stacked on to form a bump board (S30). The insulation layer 20b can be stacked over the insulation layer 20a on which the bumps 30 and the pattern 22a are formed, where the bumps 30 can be made to penetrate the insulation layer 20b. The insulation layer 20b may serve to provide electrical insulation between layers, and can be made, for example, from Prepreg.

Figure 4E:
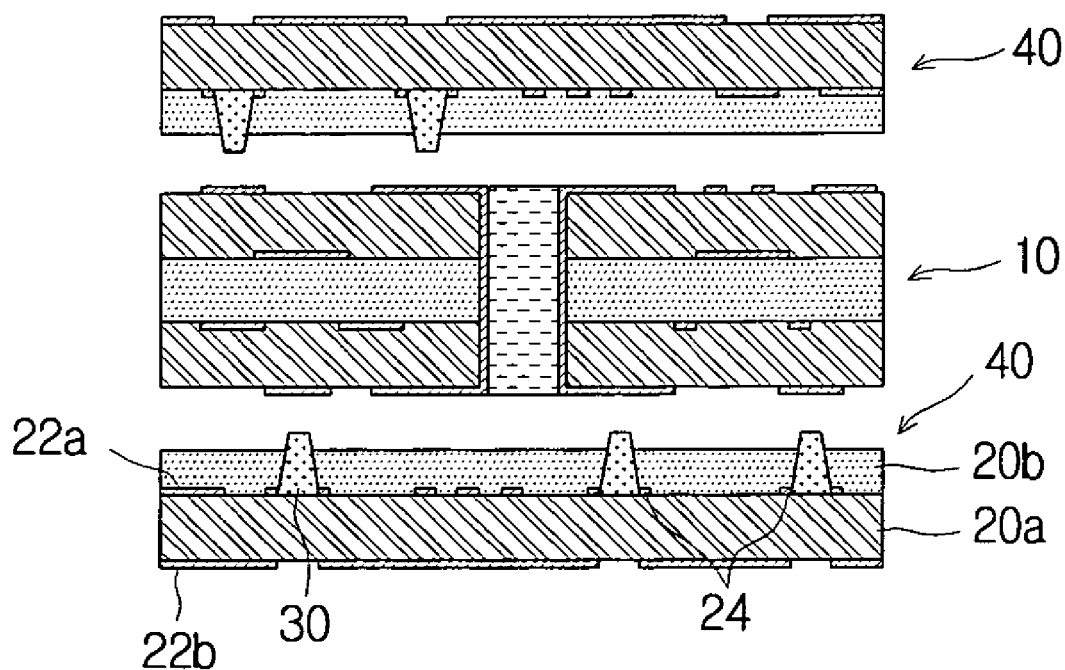
Figure 4F:
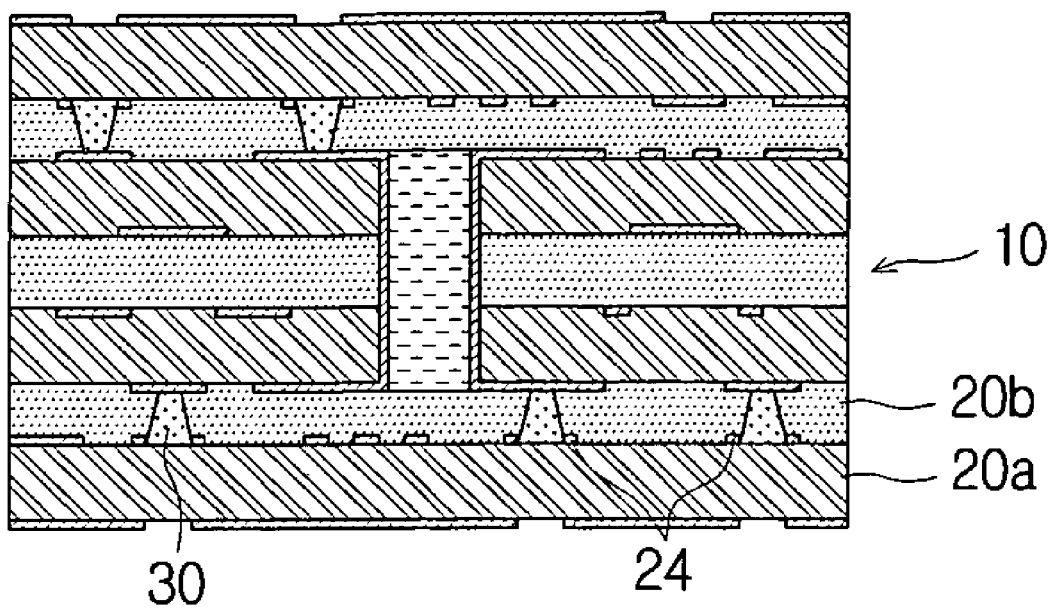

Bump boards 40 formed as above may be stacked onto a four-layer board 10, as illustrated in FIG. 4E, to implement a multi-layer printed circuit board such as that illustrated in FIG. 4F.

Figure 4G:
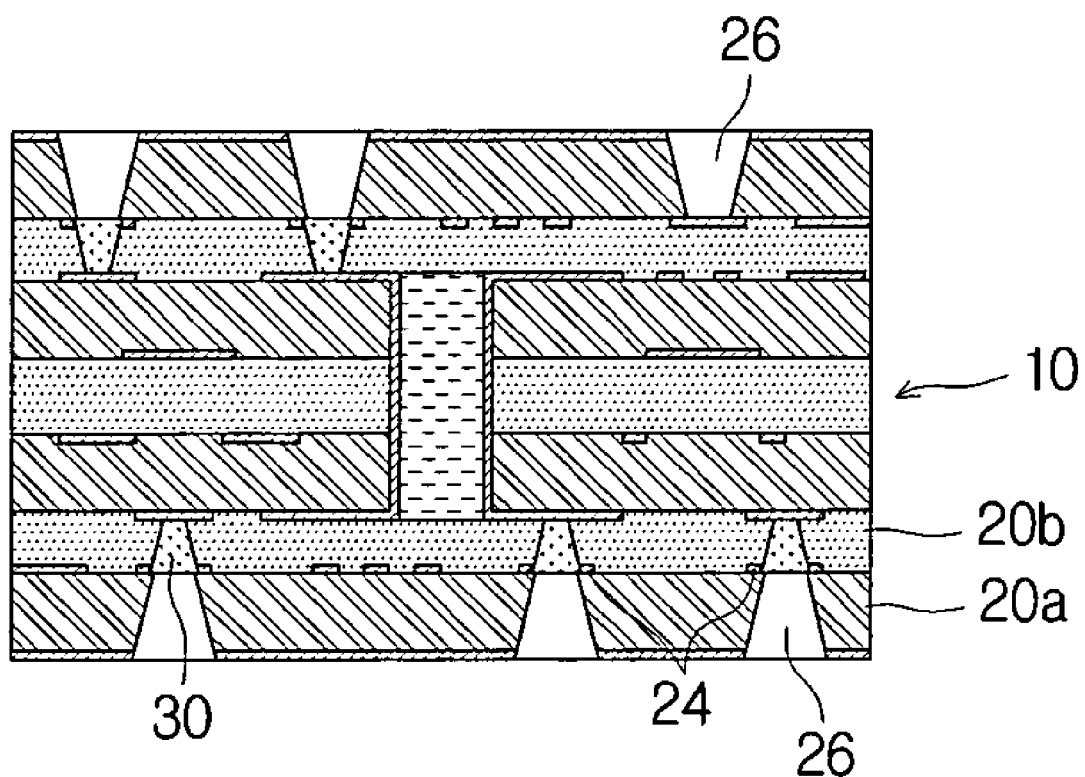
Figure 4H:
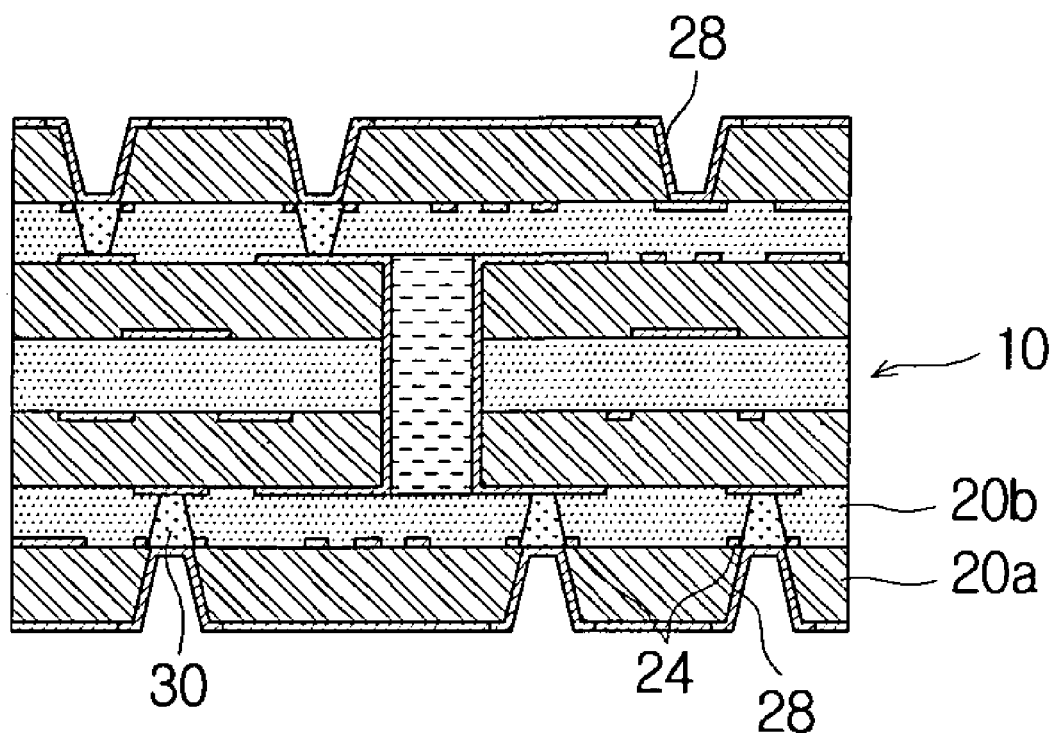

Afterwards, holes 26 can be perforated in the outermost layers, as illustrated in FIG. 4G, and interlayer conduction can be provided at the outermost layers using a method such as forming plating layers 28 in the holes 26.

Figure 7:
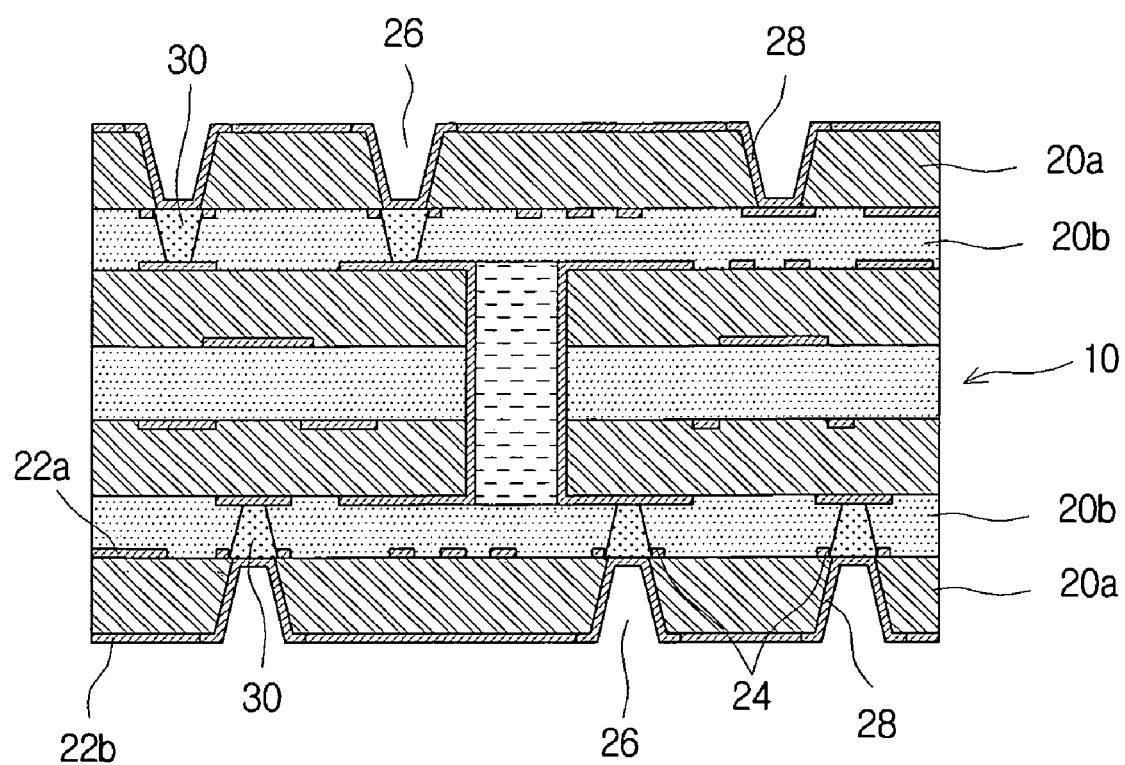
FIG. 7 is a cross-sectional view of a printed circuit board according to another aspect of the invention.

An example of a printed circuit board manufactured by the method described above is illustrated in FIG. 7. FIG. 7 is a cross-sectional view of a printed circuit board according to another aspect of the invention. In FIG. 7 are illustrated a four-layer board 10, insulation layers 20a, 20b, patterns 22a, 22b, dams 24, bumps 30, and bump boards 40.

In the case of the printed circuit board according to this embodiment, conduction between layers can be implemented by elements including the bumps 30 which penetrate the insulation layers, and the plating layers which are formed in the holes 26. A dam 24 can be formed around the edge of a bump 30 to surround the bump 30, where such dams 24 may facilitate the forming of the bumps 30 while preventing spreading.

The insulation layers 20a, on which the dams 24 are formed, and the patterns 22a, 22b formed on these insulation layers 20a can be formed by selectively removing the copper foils of a copper clad laminate, where the dams 24 can be formed by the same method, as already described above.

According to certain embodiments of the invention as set forth above, by forming dams and printing the bumps for interlayer conduction inside the dams, productivity can be improved and the problem of spreading can be resolved.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a printed circuit board by forming at least one bump for interlayer conduction on a surface of a board and stacking an insulation layer on the surface of the board, the method comprising:
    forming at least one dam and a circuit pattern on the surface of the board, the dam surrounding a region corresponding to the bump;
    forming the bump by printing conductive paste onto the region corresponding to the bump; and
    after the forming the bump, stacking the insulation layer onto the surface of the board such that the bump penetrates the insulation layer,
    the forming the dam and the circuit pattern comprising selectively etching a metal layer stacked on the surface of the board, and
    the dam and the circuit pattern being formed simultaneously.

2. The method of claim 1, wherein the dam is made of a material containing copper.

3. A printed circuit board comprising:
    a board;
    a bump formed on a surface of the board;
    a dam formed on the surface of the board and surrounding an edge of the bump;
    a circuit pattern formed on the surface of the board;
    a first insulation layer stacked on the surface of the board, wherein the bump penetrates the first insulation layer for interlayer conduction; and
    a second insulation layer,
    the board being a copper clad laminate (CCL) having a copper foil stacked on the second insulation layer,
    the dam and the circuit pattern being shaped by selectively removing the copper foil, and
    the dam and the circuit pattern being formed simultaneously.

* * * * *